United States Patent [19]

Janning

[11] 4,206,398

[45] Jun. 3, 1980

[54] METHOD OF AND APPARATUS FOR DETECTING GROUND FAULTS IN ISOLATED POWER SUPPLY SYSTEMS

[75] Inventor: Eugene A. Janning, West Chester, Ohio

[73] Assignee: ESB Inc., Philadelphia, Pa.

[21] Appl. No.: 900,182

[22] Filed: Apr. 26, 1978

[51] Int. Cl.² ........................................... G01R 31/02
[52] U.S. Cl. ..................................... 324/51; 340/651
[58] Field of Search ................. 324/51; 340/647, 650, 340/651

[56] References Cited

U.S. PATENT DOCUMENTS

| 3,066,284 | 11/1962 | McKinley et al. | 324/51 X |
| 3,666,993 | 5/1972 | Legatti | 340/650 X |
| 3,737,765 | 6/1973 | Lee et al. | 340/650 X |
| 3,891,895 | 6/1975 | Wittlinger | 324/51 X |
| 3,947,759 | 3/1976 | Briggs | 340/650 X |
| 3,950,742 | 4/1976 | MacMartin | 340/650 X |
| 3,971,007 | 7/1976 | Borkovitz | 340/651 |
| 3,976,987 | 8/1976 | Anger | 340/651 |
| 3,978,465 | 8/1976 | Goode | 340/651 |

Primary Examiner—Gerard R. Strecker
Attorney, Agent, or Firm—E. C. MacQueen; E. A. Steen

[57] ABSTRACT

A line isolation monitor for detecting ground faults in isolated power systems by determining the potential personnel hazard current due to the complex ground fault impedances and a method for accomplishing the same. The total hazard current is determined by dividing the peak line voltage of the isolated power supply by the total impedance between ground and a common mode point, such as the center tap of the primary winding of the line isolation monitor transformer connected to the isolated power supply. This impedance is determined at line frequency by impressing a minute, phase-modulated, power line frequency test signal into the isolated power system and using an extremely selective, coherent filter to remove the signals in phase with the power line signal. The magnitude of the phase modulated test signal passed through the filter is related to the amount of fault impedance. Comparison of this test signal magnitude to the line voltage provides an indication of the total hazard current.

The circuitry for accomplishing this procedure includes a closed loop system which adjusts the current level of the test signal until the voltage of the filtered test signal reaches a predetermined level related to the line voltage of the isolated system. The current level of the test signal is then related to the total hazard current.

42 Claims, 13 Drawing Figures

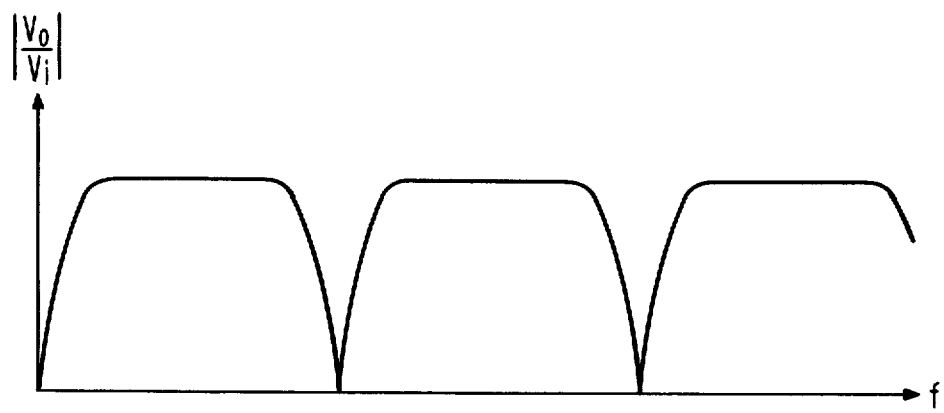
_Fig. 9_
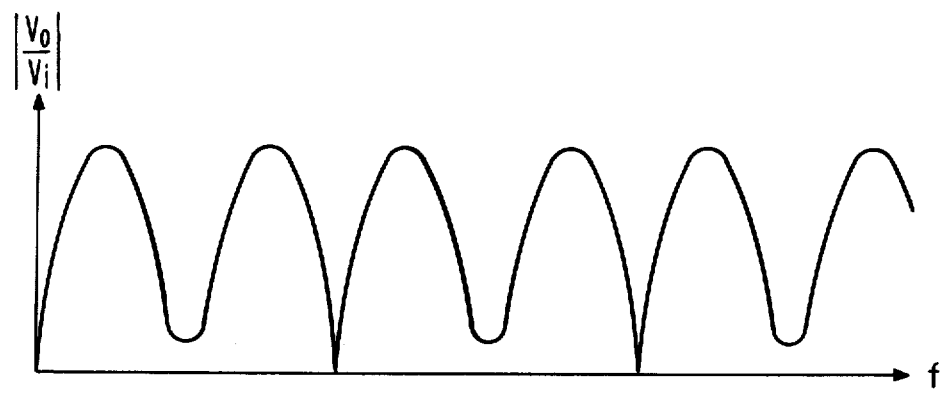
_Fig. 10_
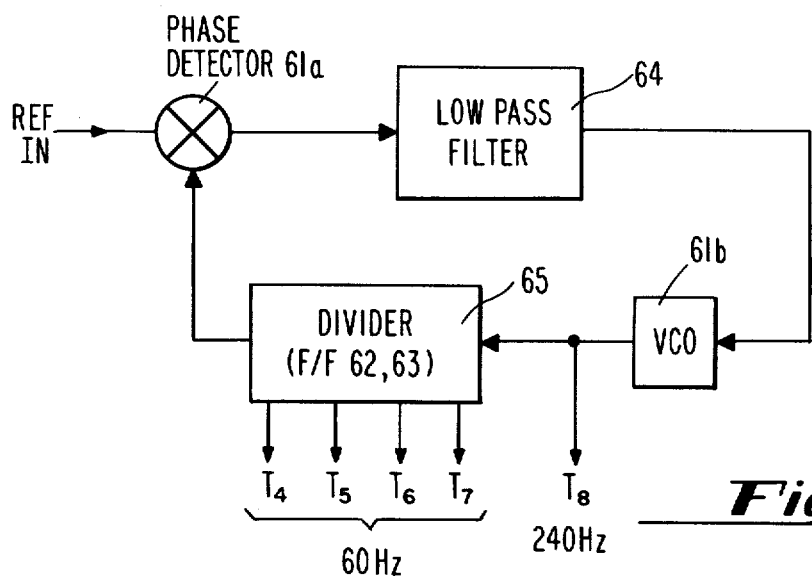
_Fig. 11_

METHOD OF AND APPARATUS FOR DETECTING GROUND FAULTS IN ISOLATED POWER SUPPLY SYSTEMS

BACKGROUND OF THE INVENTION

This invention is related to line isolation monitor (LIM) systems for detecting the leakage current to ground in an isolated power system, and more specifically to those line isolation monitor systems which impress a signal into the isolated power system to determine a particular parameter of said power system.

In recent years, hospitals have found it desirable to use isolated power supplies in areas where there is a danger of explosion from gases or shock to hospital personnel and patients from various electrical equipment, such as in operating rooms or intensive care units. Theoretically, the isolated power systems have no ground connection so that in the event one should come into contact with a power line in this power system, no power would flow to ground through this person and a shock would be prevented. Furthermore, the possibility of creating a spark which could ignite any of the explosive gases commonly found in a hospital would be significantly reduced.

Regulatory agencies, such as the National Fire Prevention Association (NFPA), have set standards for isolated power supply systems in hospitals. Today, the standard generally applied is that the maximum total leakage, or hazard current, from the isolated power supply system cannot exceed 2mA. Values greater than this are presumed to indicate the existence of a ground fault in the isolated power system which could be sufficient to permit completion of the circuit in the above example, thereby increasing the risk that a spark could be created or someone could be shocked.

There are many types of line isolation monitor systems disclosed in the prior art which give warnings when the hazard current of the isolated power supply system rises above a predetermined amount. There are several problems characteristic of those disclosed in the prior art. Some line isolation monitor systems inject a test signal into the isolated power supply which can cause severe interference with the other hospital electronic equipment connected to the isolated power supply. Others use switching techniques for sampling the power signal from the isolated system, which can introduce significant interference into the electronic hospital equipment. Still other systems introduce such a large amount of hazard current that the amount of hazard current from the isolated power system which could normally be accepted is significantly reduced. Another problem with some monitor systems is that their operation is adversely affected by electrical interference from certain hospital equipment so that the value of total hazard current indicated is not reliable. Other problems incurred with prior art line isolation monitor systems include inaccurate readings and slow response times to such a degree that the monitor system itself constitutes a safety hazard.

SUMMARY OF THE INVENTION

In accordance with a preferred embodiment, an improved method for monitoring isolated power systems and a line isolation monitor system for practicing the method are disclosed which substantially minimize the above noted problems. The particular method utilized by the improved LIM requires the use of a 60 Hertz phase-modulated test signal supplied to the isolated power system (assuming the power line signal frequency is 60 Hz), the detection of said phase modulated test signal, and a comparison of the test signal with the isolated system peak line voltage to determine the leakage current in the isolated power supply system.

Generally speaking, the LIM circuit is constructed as a closed loop and operates as follows. A test signal is injected into the isolated power supply system at a common mode impedance point by a signal generator in the closed loop circuit. The test signal, as stated above, has the same frequency as the power signal in the isolated supply system, but is out of phase with said power line signal and slowly phase-modulated. A coherent filter is used to separate the out of phase test signal from the stationary power line signal. The magnitude of the test signal voltage is then determined and compared with the maximum peak line voltage in the isolated power supply system. The result is integrated within the closed loop with the integrator output controlling the current level produced by the test signal generator. The closed loop is designed so that when the magnitude of the coherent filter output and the magnitude of the peak voltage in the isolated power supply are equal, or related by a predetermined factor, the current value of the test signal impressed on the isolated power supply is related to the actual leakage current in the isolated power supply.

A meter reading of the test signal current provides a visual indication of the actual total hazard current. Audible and visual alarm means provide immediate warnings that the total hazard current has reached an unsafe level.

The subject invention provides several advantages over the prior art. A very important advantage is that the actual total hazard current can be determined because the ground fault impedance is detected at power line frequency. No switching is required because the testing procedure is continuous, thereby minimizing any interference with hospital equipment connected to the isolated system. Proper scaling of the system components and use of the coherent filter permit use of a low-current test signal. The monitor system connects to the isolated system in such a manner that its contribution to the total hazard current is almost negligible.

While the discussion of the subject invention is directed to the LIM's use with isolated power systems, it can be appreciated that this invention may have application in other similar environments wherein analyzation of a particular physical aspect of an electrical system is required while that system is in use.

A better understanding of the invention and its advantages can be seen in the following description of the figures and the preferred embodiment.

DESCRIPTION OF THE DRAWINGS AND THE PREFERRED EMBODIMENT

FIG. 9 is a frequency response curve of a typical commutated capacitor array.

FIG. 10 is a frequency response curve of the commutated capacitor array utilized in coherent filter 32.

FIG. 11 is a block diagram illustrating the operation of phase-locked loop 44.

Figure 12:
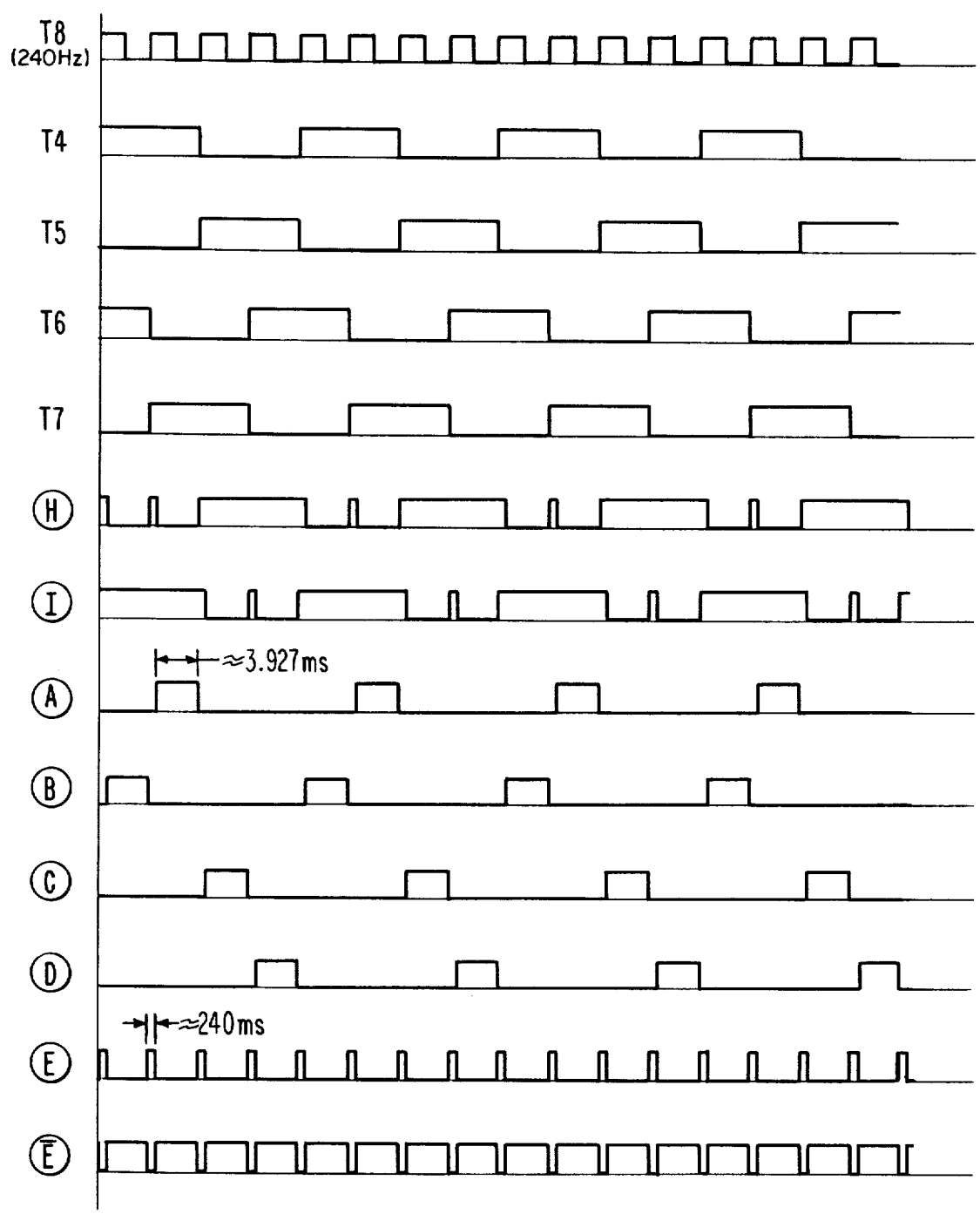

FIG. 12 shows the various pulse trains associated with the operation of phase locked loop 44, sample/hold timing circuit 46, and commutated capacitor array timing circuit 47.

Figure 13:
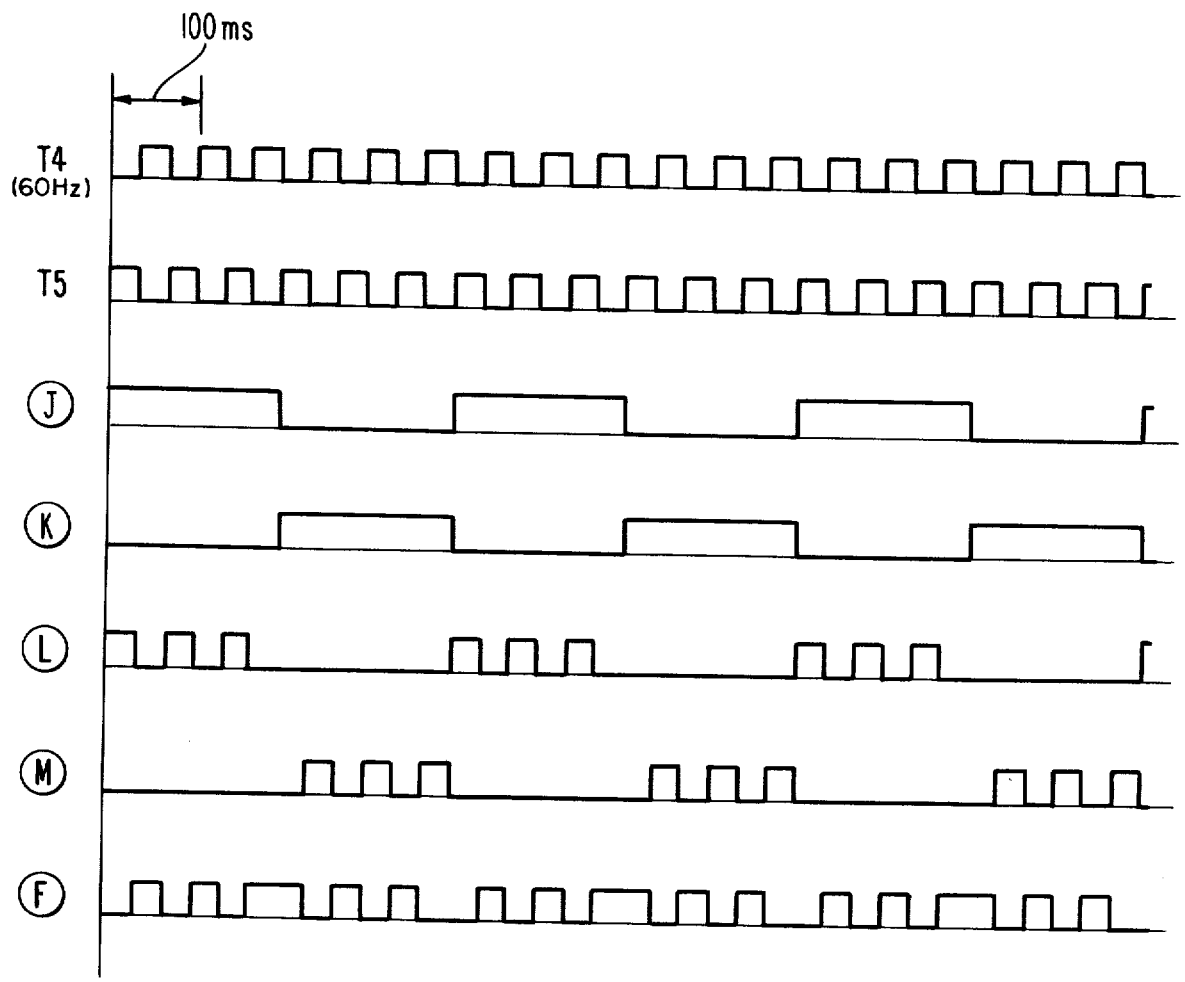

FIG. 13 shows the various pulse trains associated with the operation of phase modulator 56.

Figure 5:
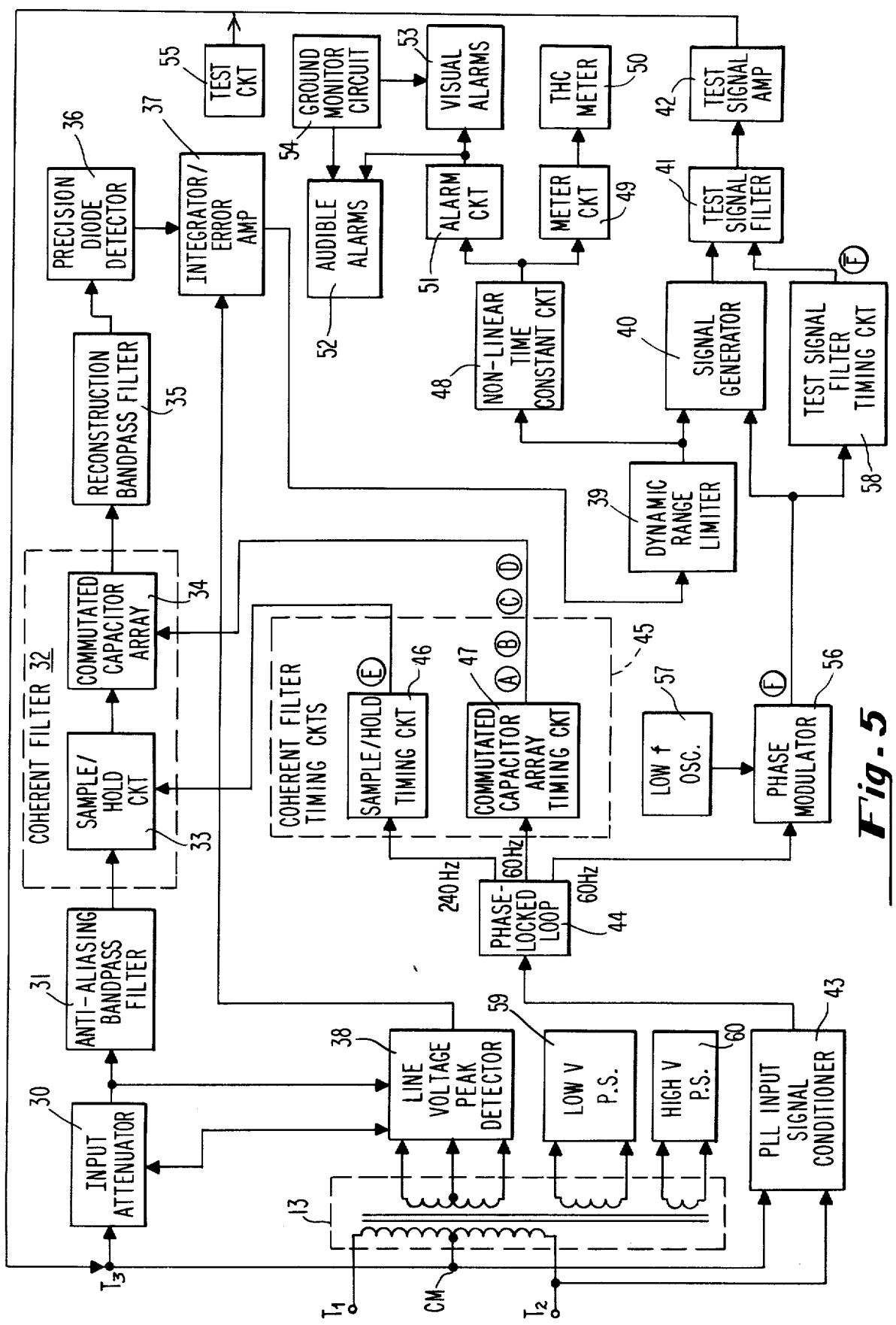
FIG. 5 is a detailed block diagram of the line isolation monitor.
Figure 6:
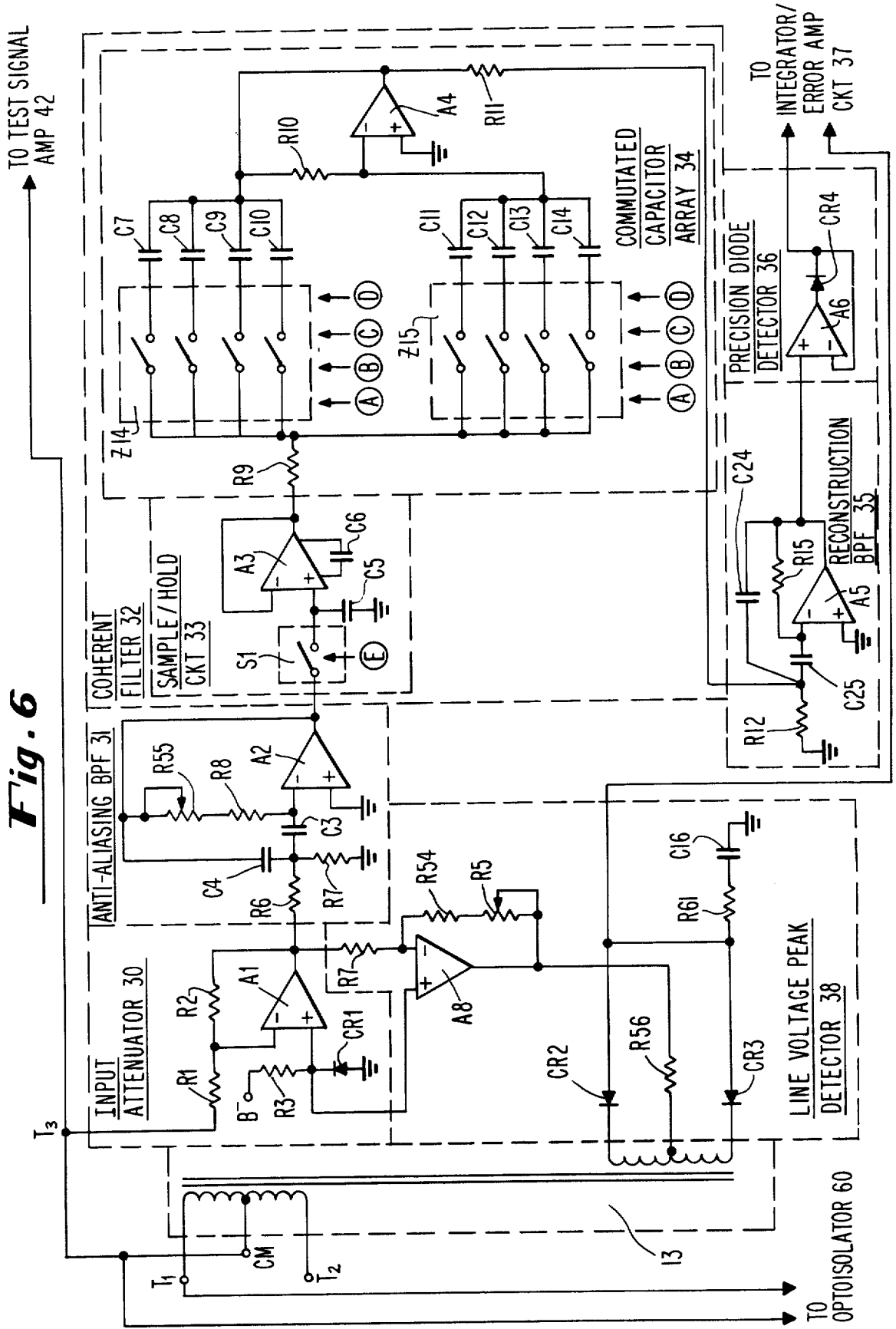
FIG. 6 is a detailed circuit diagram of a portion of the components illustrated in FIG. 5.
Figure 7:
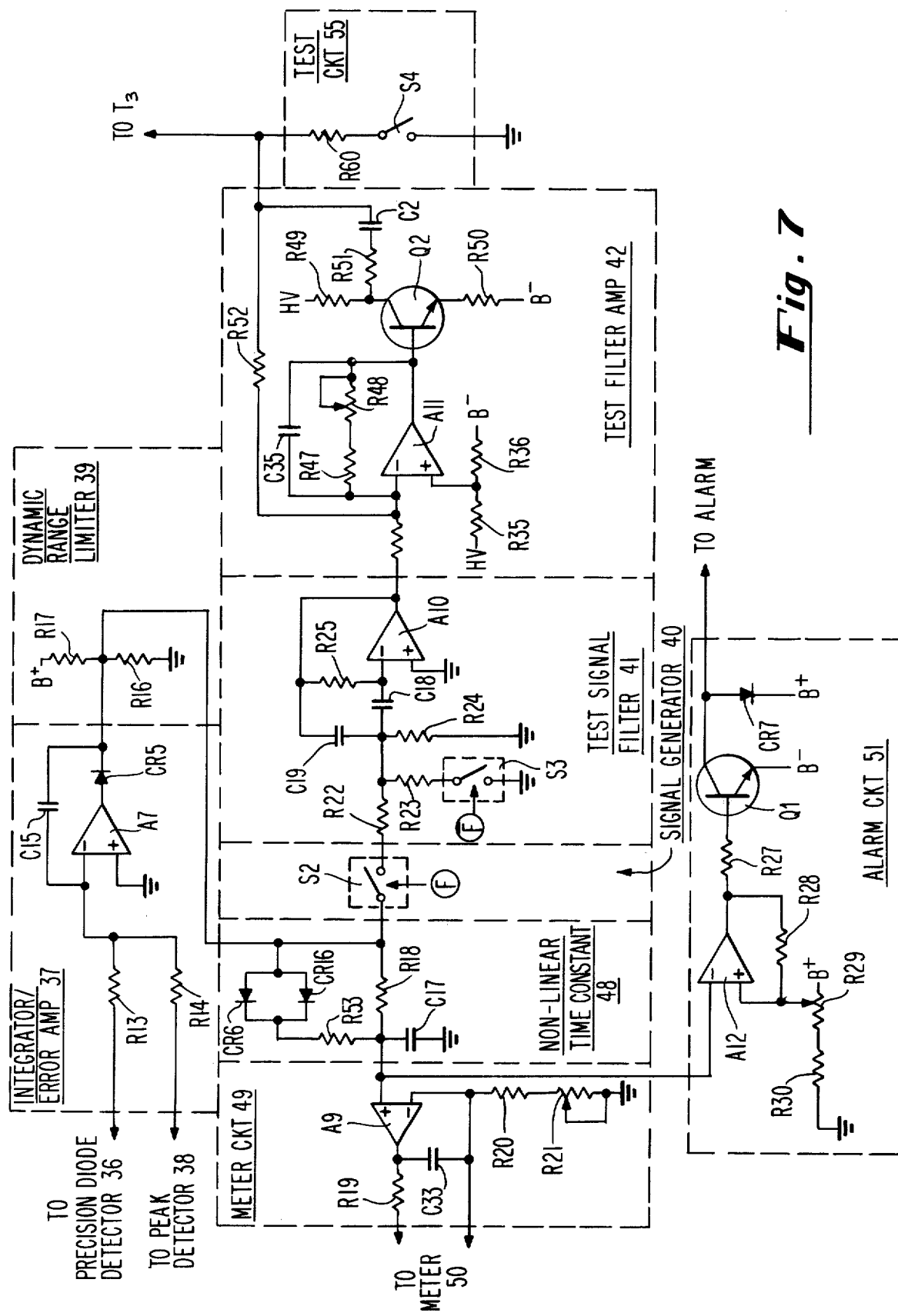
FIG. 7 is a detailed circuit diagram of another portion of the components illustrated in FIG. 5.
Figure 8:
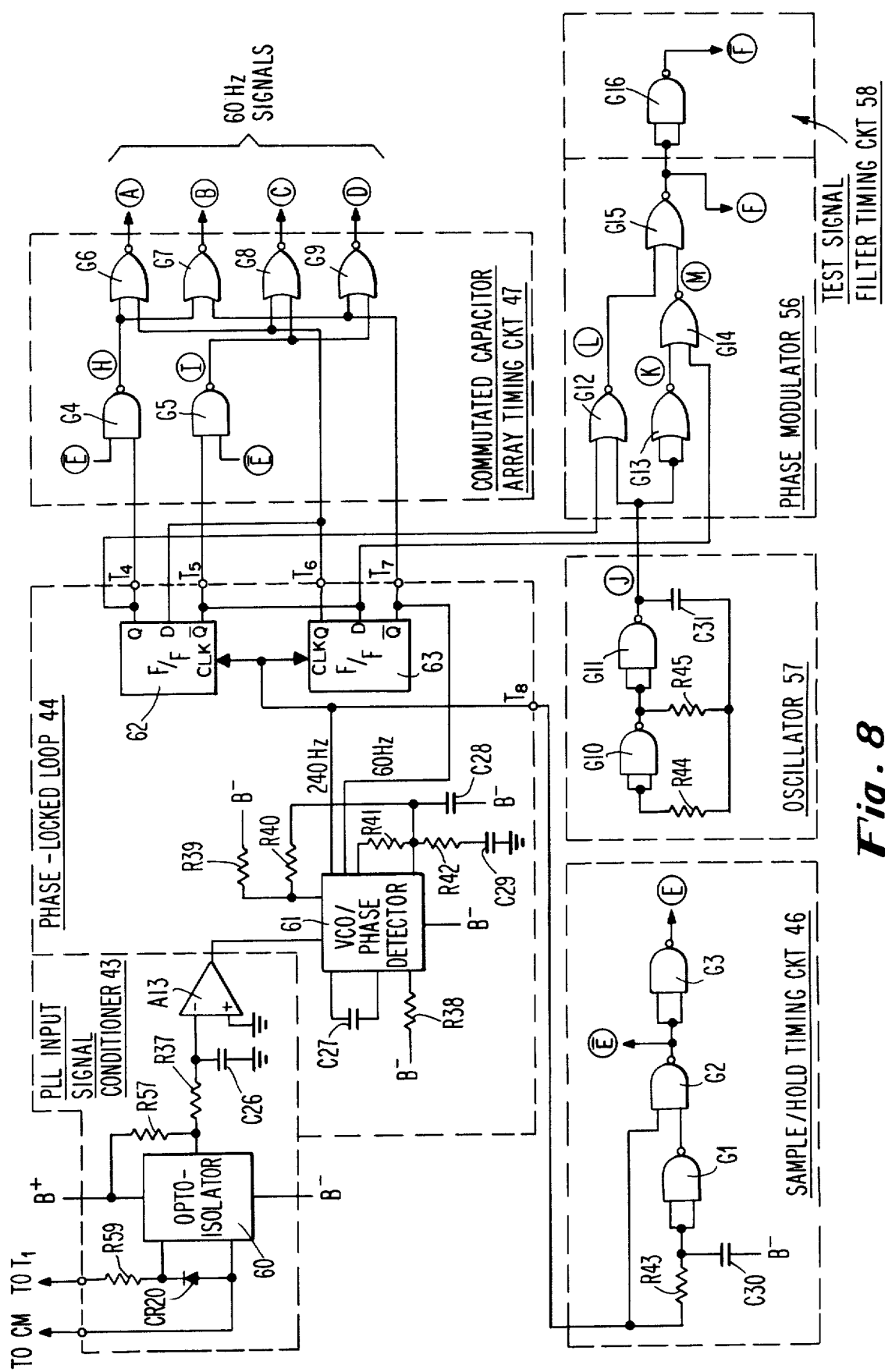
FIG. 8 is a detailed circuit diagram of still another portion of the components illustrated in FIG. 5.

The following discussion on the line isolation monitor and its operation will begin first with a brief discussion of the theory behind the development of this line isolation monitor and its basic method of operation, and then proceed to the basic block diagram shown in FIG. 5 before finally discussing the specific elements as illustrated in FIGS. 6, 7 and 8.

In this specification and the following claims, references to "isolated power system" include the equipment connected to the power system for the purpose of obtaining power therefrom. "Hazard current" or "leakage current" refers to that flow of electricity from the isolated power system to ground which would take place in the event part of the isolated power system became grounded. "Ground fault impedance" refers to the impedance between the isolated power system and ground through a fault, such a partial or total failure in the insulation, as well as the impedance between ground and any point in the isolated power system not meeting the technical requirements of being a fault. "Power line signal" refers to the power signal on both power lines of the isolated power system. The term "coherent filter" is used to refer to a filter having a coherent pulse operation as a basis of its operation, in which a fixed phase relationship is maintained from one pulse to the next. "Discrete-time" signal refers to a signal wherein its value may change at one or more points only at discrete values of time.

Figure 1:
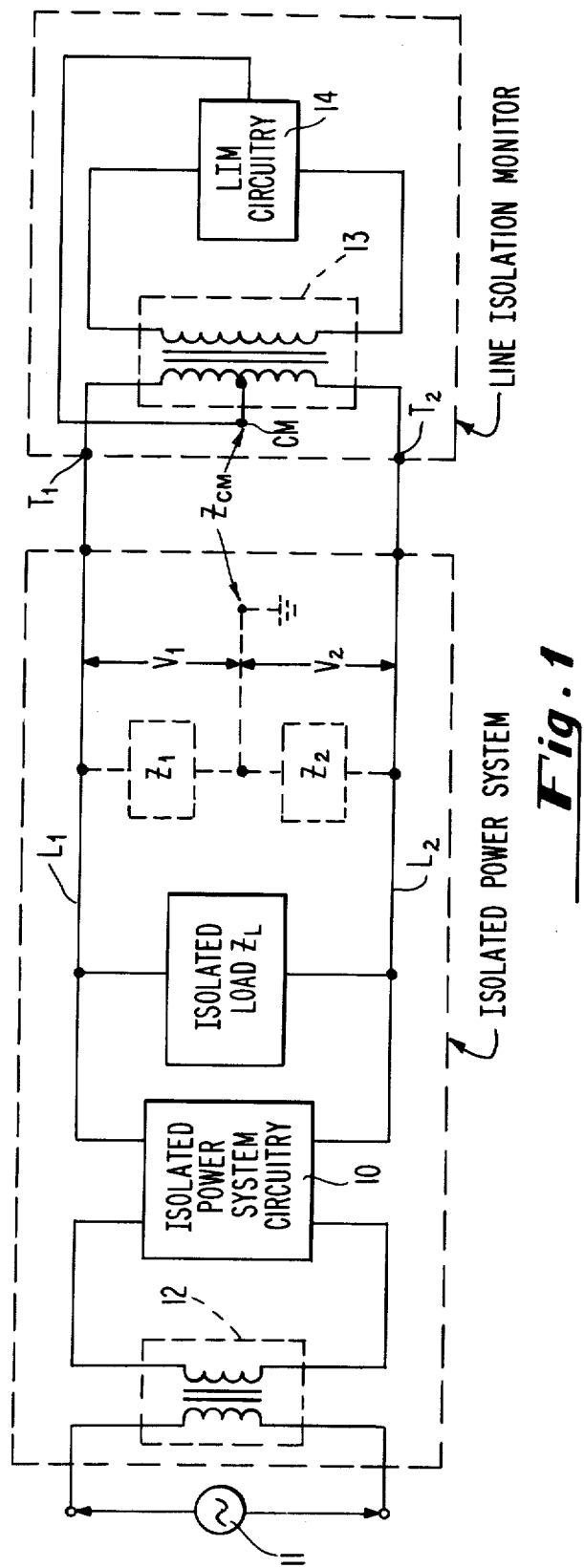
FIG. 1 is a schematic drawing illustrating generally an isolated power system connected to the line isolation monitor.

Referring to FIG. 1, the isolated power system circuitry 10 of the isolated power system receives power from a utility power company or other appropriate source, indicated as power generator 11, through isolation transformer 12, and provides the necessary power for isolated load $Z_L$. In theory, no part of the isolated power system connected to the secondary winding of transformer 12 should ever connect to ground. However, as a practical matter, there is always some impedance, though it be extremely high, between the power lines and components of the isolated power system and ground, and between the isolated load $Z_L$ and ground. In FIG. 1, this "fault" impedance is symbolized by $Z_1$ and $Z_2$, and is shown in phantom. $Z_1$ and $Z_2$ symbolize the total fault impedance between power lines L1 and L2, respectively. Because of weaknesses in the power line insulation or in the type, quantity or quality of equipment constituting the isolated load, the fault impedance can decrease to an amount sufficient to permit substantial leakage current to ground, in the event the isolated power system becomes grounded. When the potential leakage current rises above 2mA, a dangerous condition may exist. A further rise in leakage current may create a condition which results in shocking a patient possibly driving his heart into fibrillation, or which provides the spark necessary for ignition of flammable gases often used in an operating room.

When monitoring the hazard current in an isolated power supply, the greatest hazard current, that through $Z_1$, or $Z_2$, must be determined. To accomplish this result, the value of ground fault impedances $Z_1$ and $Z_2$ must be determined. Since the voltages across $Z_1$ and $Z_2$, $V_1$ and $V_2$, are known, or can be easily determined, the hazard current through $Z_1$ and $Z_2$, $I_1$ and $I_2$, can then be determined. Using this indirect means of determining the hazard current thereby helps overcome many of the aforementioned problems in the prior art, since sampling techniques need not be utilized.

To better understand the operation of the subject invention, a more basic analysis is required. For purposes of simplifying the analysis, the common mode fault impedance, the fault impedance between ground and a common mode impedance point in the isolated power supply, will be monitored. The common mode impedance point is that point having a common electrical relation with power lines $L_1$ and $L_2$, wherein the magnitude of all ground faults appear in parallel. In other words, the total magnitude of a ground fault is the same when measured through either power line, $L_1$ or $L_2$. The center tap on the primary winding of the line isolation monitor transformer 13 is selected as the common mode impedance point for simplification of the analysis and is identified by "CM". $Z_{CM}$ is shown in FIG. 1 as the impedance between terminal CM and ground.

Figure 2:
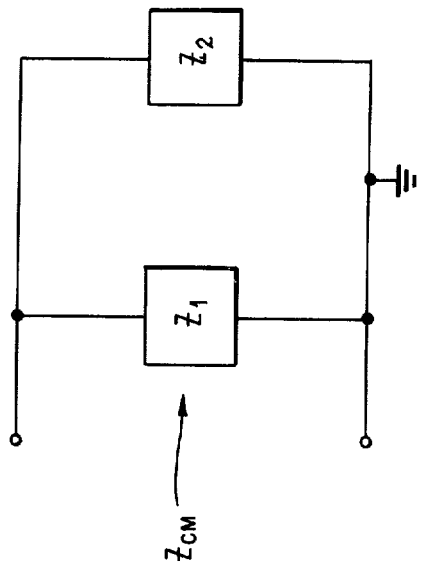
FIG. 2 is an equivalent circuit for the fault impedances of the isolated power system.

The actual $Z_{CM}$ can be simplified into the equivalent circuit shown in FIG. 2, wherein fault impedances $Z_1$ and $Z_2$ are connected in parallel. This equivalent circuit is obtained by assuming that the power lines in the isolated power supply have very little mutual impedances between them and that the magnitudes of fault impedances $Z_1$ and $Z_2$ are very high as compared to this low mutual impedance.

For the purposes of this analysis, only the magnitude of $Z_{CM}$ is of interest. By ignoring phase angles, and using equations readily available to those skilled in the art, it can be shown that the fault current through fault impedance $Z_1$, is equal to the voltage across fault impedance $Z_2$ divided by the common mode impedance $Z_{CM}$, or $$|I_1| = \frac{|V_2|}{|Z_{CM}|}$$

Similarly, the fault current through impedance $Z_2$, is equal to $V_1$ divided by the common mode impedance, or $$|I_2| = \frac{|V_1|}{|Z_{CM}|}$$

Since only the highest hazard current is of concern, $V_1$ and $V_2$ must first be determined. Then the magnitude of $Z_{CM}$ can be divided into the larger quantity. While the measurement of $V_1$ and $V_2$ is straightforward and may be accomplished in many fashions, the determination of $Z_{CM}$ is quite difficult.

$Z_{CM}$ can be and is usually a complex function having any phase angle, which results in its magnitude varying as a function of the frequency. To make an accurate calculation of the hazard current in an isolated power supply, the magnitude of $Z_{CM}$ must be known at the power line frequency. It is this requirement in which the prior art systems are lacking. The ideal situation for determining $Z_{CM}$ is to measure minute test currents at the power line frequency simultaneously with the presence of large power line voltages at the same frequency, thereby minimizing the disturbances imparted to the isolated power supply system by the line isolation monitor. However, this technique requires extremely sensitive and accurate filtering to recover the test signal.

Figure 3:
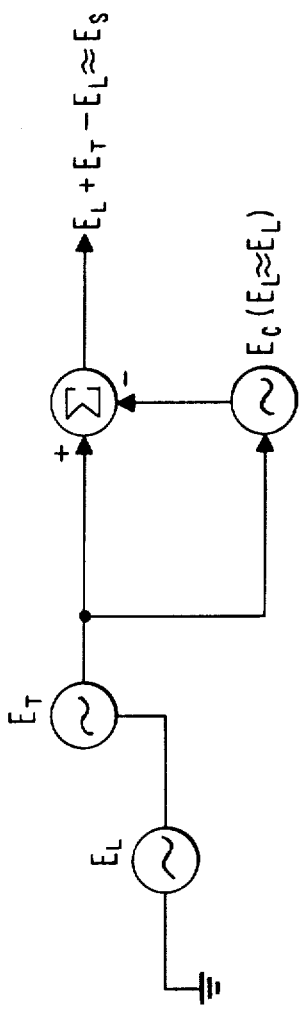
FIG. 3 is a schematic drawing illustrating the functional operation of the coherent filter.

The technique of the present invention for recovering the test signal takes advantage of the characteristic of power line signals that their phase angle tends to be quasi-stationary and their voltages remain constant for relatively long periods of time. As a result, the high voltage power line signals may then be removed by a simple subtraction process. The procedure for doing this is demonstrated schematically in FIG. 3. The test signal placed in the isolated power supply is equivalent to the sum of two voltage generators, the power line generator producing a power line component $E_L$ and the test signal generator producing a signal $E_T$. The test signal component is "reacquired" at the summation point by subtracting the signal $E_C$ from a coherent generator. This coherent generator operates by averaging the sum of $E_L$ and $E_T$ over a long time interval and generating an output which very closely approximates the steady state line voltage component $E_L$, both in magnitude and phase.

The resulting transfer function of this operation appears as an extremely selective filter which removes the power line component and leaves only the desired test signal. To best accomplish this function, a coherent filter is selected for the preferred embodiment.

The test signal should meet three requirements. The first is that its frequency be the same as the power line signal frequency so that the fault impedance may be determined at power line frequency. This requirement also assures that the test signal will not be filtered out before it reaches the coherent filter. The second requirement is that the test signal not be in phase with the power line signal, and that its phase differential vary with respect to the power line signal phase for a significant duration of the averaging time for the coherent signal operator. Another criteria, though unrelated to filtering, is that the magnitude of the test signal voltage and current be small enough to not interfere with instruments connected in the isolated power system or to introduce too great of a hazard current itself.

Figure 4:
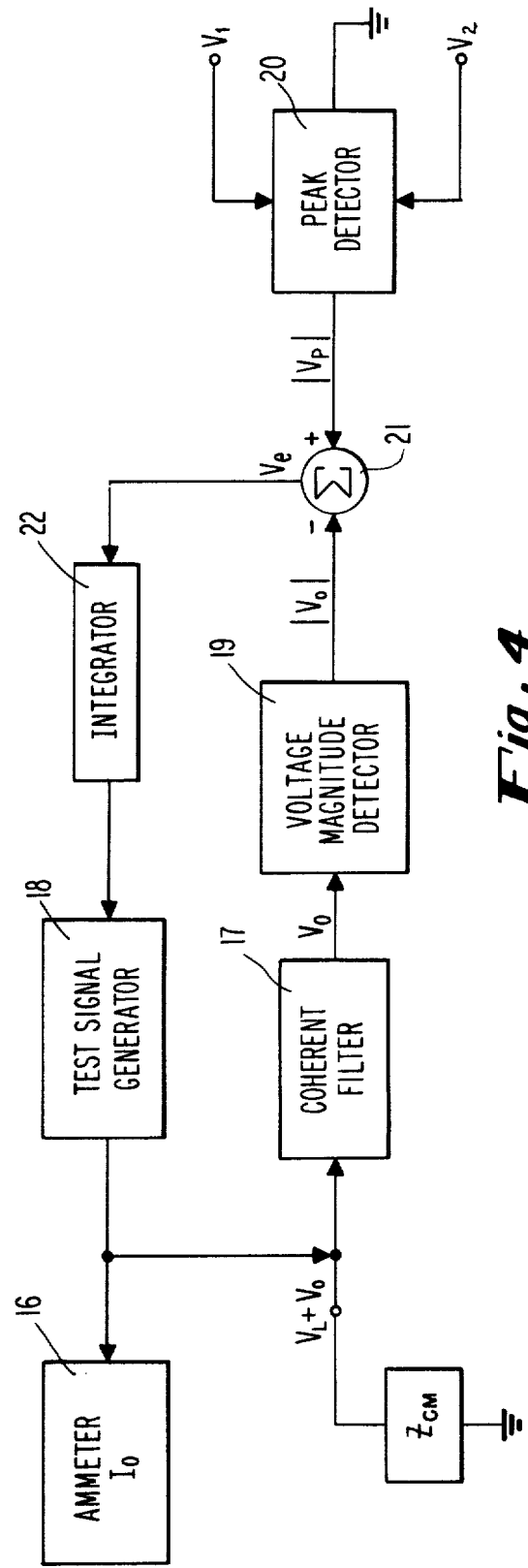
FIG. 4 is a schematic block diagram illustrating the general closed loop operation of the line isolation monitor.

FIG. 4 provides a more detailed block diagram illustrating the general functions of the LIM closed loop, which includes determining the magnitude of $Z_{CM}$ and the maximum value of $V_1$ or $V_2$, from which the actual hazard current can be determined. Ammeter 16 indicates the magnitude of the test current, $I_o$, being applied to impedance $Z_{CM}$. Coherent filter 17 receives an input signal having two components, $V_L$ and $V_o$. $V_L$ is the power line signal voltage (of $E_L$ in FIG. 3) with its appropriate phase. $V_o$ is the voltage across $Z_{CM}$ resulting from the phase modulated test signal being applied to $Z_{CM}$. Coherent filter 17 provides the function of extracting the combined power line signal and test signal from the isolated power system and of separating the test signal component from the power line signal component. A more detailed explanation of the operation of the coherent filter appears below.

Voltage magnitude detector 19 receives the recovered test signal ($V_o$) from coherent filter 17 and produces an output related to the absolute value of the peak value of $V_o$. Meanwhile, peak detector 20 provides a signal $V_p$ related to the absolute value of the peak value of $V_1$ or $V_2$, whichever is higher. The values of $V_o$ and $V_p$ are then summed at summation point 21 to produce an error signal $V_e$ related to the difference between these two values, which is integrated by integrator 22. Integrator 22 produces a control signal for controlling test signal generator 18 to vary the current level in the test signal produced. Generator 18 also maintains the test signal frequency at the power line signal frequency and appropriately varies the phase with respect to the power line signal to satisfy the above noted requirements.

The closed loop system operates by driving the $V_e$ to zero, thereby causing the absolute values of the peak values of $V_o$ and $V_p$ to become approximately equal. The output of integrator 22 is then established at a constant level in a steady state condition. In other words, the current produced by test signal generator 18 is adjusted until $V_o$ approximately equals $V_p$. The current reading provided by ammeter 16 is then the actual hazard current in the isolated power supply.

In the event the fault condition changes within the isolated power system, the error voltage, $V_e$, momentarily becomes non-zero, which drives the integrater output to a new level, thereby changing the current produced by test signal generator 18. Once a steady state condition is again reached, the new value of $I_o$ is indicated by ammeter 16.

Ideally, the amount of test current used should only be a few microamperes so that a significant hazard current is not injected into the supply system by the monitor itself. Proper scaling on the various stages of the circuit will enable this requirement to be met while actually providing an output related to the hazard current. The scaling also reduces the voltage level throughout the LIM circuitry to values that are easier to handle by the various circuit elements.

Referring to FIG. 5, a block diagram of a preferred embodiment for the line isolation monitor system can be seen. The terminals labeled T1 and T2 connect to power lines L1 and L2 for the isolated power system, as illustrated in FIG. 1. Transformer 13 remains the same as that shown in FIG. 1.

The various blocks identified in FIG. 5 constitute LIM circuitry 14 generally shown in FIG. 1, and perform the functions shown in FIG. 4. The upper portion of the block diagram of FIG. 5 contains the major components of the forward signal path. Terminal T3 designates the point where the feedback loop connects with the main signal path and the common mode impedance point, the center tap of the primary side of transformer 13. The combined test signal and power line signal extracted at the common mode impedance point is attenuated to a level capable of being handled by operational amplifiers by input attenuator 30. Anti-aliasing bandpass filter 31 eliminates undesired frequencies in the signal received by coherent filter 32. This function is required so that harmonics of power line frequency would not be interpreted as part of the test signal by coherent filter 32.

The coherent filter, as discussed above, is designed to eliminate stationary signal patterns, but to pass signals which are not stationary. Since the power line frequencies remain stationary, they are filtered out. However, the test signal phase is modulated sufficiently with respect to the power line frequency so that it will not be detected as a stationary signal and will be passed through the filter.

Coherent filter 32 requires two systems, sample/hold circuit 33 and commutated capacitor array 34. Sample/hold circuit 33 is clocked at a high frequency (responsive to pulse train "E") to transform the input signal into a discrete-time signal. Capacitor array 34 is then clocked at the same frequency (responsive to pulse trains "A", "B", "C" and "D") so that a coherent subtraction of the discrete-time signal is obtained, thereby resulting in the removal of any signal in phase with the power line signal. The timing control for these elements of coherent filter 32 includes a phase-locked loop responsive to the power signal which will be discussed below.

The test signal which is passed by filter 32 is still in the discrete-time form and must be reconstructed in its original time domain. This function is accomplished by reconstruction band-pass filter 35. The reconstructed real time signal is then rectified by precision diode detector 36 prior to its introduction into the integrator/error amplifier circuit 37. Circuit 37 also receives a signal related to the maximum peak value of the two line voltages, as measured with respect to ground, which is produced by line voltage peak detector unit 38. Circuit 37 then averages the detected test signal and compares it to the maximum line voltage peak value and produces a resultant output proportional to the maximum hazard current, as generally discussed above.

Continuing with the elements in the feedback path of the closed loop system, dynamic range limiter 39 improves the LIM system stability by limiting the range of currents to which the LIM will respond. Range limiter 39 is designed so that the LIM will not respond to any total hazard current readings which are less than 5% of full scale. In other words, assuming that the maximum hazard current which can be indicated by the LIM is 3 mA, a total hazard current of nearly 150 microamps is required before a reading is provided.

Signal generator 40 then converts the resultant DC output of integrator/error amplifier circuit 37 into a signal containing the power line frequency and its harmonics. At the same time, signal generator 40 adds a periodic 180° phase shift to its output signal, in response to phase modulator 56. The resultant signal is a pulse train whose amplitude is related to the total hazard current, whose frequency is identical to the power line signal frequency, and whose phase periodically shifts 180°.

Test signal filter 41 removes the harmonics of the power line frequency in the signal generated by generator 40, smooths out the sudden phase shifts, and converts the pulse wave to a sine function. The resulting phase-modulated, line frequency test signal is then converted into a current signal and amplified by amplifier 42 before it is injected into the isolated power system.

As stated above, the operation of the LIM is dependent upon the frequencies and phases of the power signal in the isolated power system. To provide the proper control over the LIM circuit components, a timing system utilizing a phase-locked loop input signal conditioner 43, phase-locked loop 44, and coherent filter timing circuits 45 is used. Signal conditioner 43 "cleans" the reference input signal for phased-locked loop 44. A low-pass filter removes transients before other circuit elements in conditioner 43 convert the signal into a pulse train.

Phase-locked loop 44 provides one output having a frequency of 240 Hz with half-cycle pulse widths (see clock pulse train in FIG. 12) and four quadratured pulse trains having frequencies of 60 Hz with half cycle pulse widths (see pulse trains T4, T5, T6 and T7 in FIG. 12), all of which are phase-locked to the power line frequency. Only two 60 Hz outputs are shown in FIG. 5 for simplification. The actual circuit configuration is shown in more detail in FIG. 8 and will be discussed below. Sample/hold timing circuit 46 receives the 240 Hz output and reduces the pulse width for controlling the operation of sample/hold circuit 33 of coherent filter 32. Commutator capacitor rate timing circuit 47 receives four 60 Hz outputs from phase-locked loop 44 and generates pulse trains "A", "B", "C" and "D" which serve as timing signals for controlling the operation of commutated capacitor array 33 of coherent filter 32. Another 60 Hz output of phase-locked loop 44 drive phase modulator 56, to produce output pulse train "F", which in turn causes the signal generated by generator 40 to be phase modulated. Test signal filtering timing circuit 58 inverts pulse train "F" and controls the impedance value of filter 41 despite impedance changes caused by generator 40.

Indicator systems are provided to display the total hazard current measured and to provide an alarm should this total hazard current rise above a predetermined level. An input into the indicator systems is provided from the output of dynamic range limiter 39. A nonlinear time constant circuit 48 is used to provide a fast response to large changes in the total hazard current and to maintain good noise performance under steady state conditions. Meter circuit 49 converts the output of time constant circuit 48 into a current which drives total hazard current meter 50. Alarm circuit 51 activates audible alarms 52 and visual alarms 53 when a predetermined threshold point is reached, indicating that the total hazard current has become too great, for example, rises above 2 mA.

Ground monitor circuit 54 detects a loss of a ground connection, or in other words, continuity with ground, with the LIM. Audible alarms 52 and visual alarms 53 are then activated in response to detection of a ground loss condition.

A test circuit 55 is also provided which permits simulation of a fault to test the operating condition of the LIM. Upon depressing test switch, a simulated 2.5 mA fault is placed on the power line and continuity with the power line ground is broken. Meter 50 can then be checked for the appropriate reading.

A specific system for accomplishing the functions of alarms 52 and 53 monitor circuit 54, and test circuit 55 is shown in U.S. Pat. No. 3,983,554, issued to Goode.

The required DC voltages for the circuit elements in the various LIM systems are provided by low voltage power supply 59 and high voltage power supply 60, both connected to the secondary side of transformer 13.

Referring to FIGS. 6, 7 and 8, a more detailed explanation of the LIM circuit and its operation will be provided. Input attenuator 30 functions to scale down the voltage at the center tap of power transformer 13, terminal CM. This stage also serves to isolate power lines L1 and L2 of the isolated power system from ground and to temperature compensate diodes CR2 and CR3 in the line voltage peak detector 38.

Resistors R1 and R2 determine the ratio by which the input signal is scaled down. Preferably, the value of resistor R1 is selected to provide a high input impedance for the attenuator stage to minimize the amount of hazard current created by the LIM. Use of an R1 equal to 22 megaohms can limit the approximate hazard current contribution to about 3 microamps. Maintenance of this value at a low level thereby allows for more hazard current in the isolated power system before the threshold value is reached. Amplifier A1 serves as a low impedance driver which enables the use of the high input impedance at this stage without materially affecting the operation of filter 31.

The temperature compensation aspect of attentuator stage 30 consists of resistor R3 and diode CR1. Diode CR1 is selected so that it has a $-2mV/°C$ drift and is connected to CR2 and CR3 through amplifier A7 and resistor R56 such that the resultant net drift is zero.

Anti-aliasing band-pass filter 31 is an active filter used to band limit the frequency content of the input signals for coherent filter 32 to 60 Hz. Without this operation, frequencies above 120 Hz would be converted into frequencies below 120 Hz by the sampling process of sample/hold circuit 33, thereby resulting in contributions to the test signal amplitude which are not due to the test signal itself.

The filter is designed to have a center frequency of 60 Hz and a Q factor of 2, wherein Q is related to the equivalent resistances of R55, R8, R6 and R7. Potentiometer R55 is used to adjust the center frequency of filter 31. While the gain of amplifier A2 is equal to $2Q^2$, resistor R6 and R7 are used to reduce the total filter gain to unity, thereby preventing amplifier A2 from becoming saturated.

The operation of coherent filter 32 will now be discussed. Sample/hold circuit 33 includes sample gate S1, hold capacitor C5, and operational amplifier A3. The function of sample/hold circuit 33, as discussed above, is to transform the input signal into a discrete time signal wherein the power line frequency component can be removed by commutated capacitor array 34, leaving the test signal component. Gate switch S1 is clocked in response to a 240 Hz signal produced by phase-locked loop 44 and sample/hold timing circuit 46, designated by the encircled "E". A sample waveform for timing signal "E" is shown in FIG. 12 and will be discussed in more detail below.

Hold capacitor C5 converts the input signal for commutated capacitor array 31 into a "staircase" waveform by holding a charge related to the last signal increment sampled. Amplifier A3 acts as a output buffer to prevent a charge on capacitor C5 from leaking to ground during the hold or sampling period of gate switch S1. The resultant "staircase" waveform, assuming a 60 Hz input signal and 240 Hz sampling signal at "E", would then have four "steps" for each complete cycle.

Commutated capacitor array 34 includes two groups of capacitors, a first group with array capacitors C7, C8, C9 and C10, and a second group having array capacitors C11, C12, C13 and C14, each capacitor being connected in series with its respective commutating switch, S7–S14. Two separate groups of capacitors are used to improve the filter selectivity, and to remove most of the steady-state line noise from the isolated power supply lines. For instance, if only one group of commutated capacitors was utilized, the filter response would look similar to that illustrated in FIG. 9, with no rejection of steady state frequencies in between the notches. However, the use of two groups of capacitor arrays provides a location in between notches for attenuation of steady state frequency signals, as is shown in FIG. 10. Furthermore, the resultant frequency response permits the LIM to be designed so that the test signal is phase modulated at frequencies having the least attenuation, thereby enhancing the recovery of the test signal while improving the signal to noise ratio. The net result is that a smaller test signal may be used, with its attendant advantages.

The input terminals for the various commutating switches of capacitor array 34 receive staggered output signals from commutated capacitor array timing circuit 47, whereby each of the four capacitors in each capacitor group is sequentially commutated by closing its respective commutating switch in response to a pulse in its assigned pulse train, A, B, C or D. For example, assuming a 60 Hz power signal from the isolated power system, each capacitor in each capacitor group is connected into the LIM circuit once during each cycle of the power signal, and at the same time in each cycle. Using the pulse trains shown in FIG. 12 for A, B, C, and D, the commutating sequence for each 60 Hz cycle would be S8 and S12, S7 and S11, S9 and S13, and finally S10 and S14. Since each array capacitor is connected to the power line input signal at the same point on the curve for each cycle, the capacitor sees no voltage change and no signal passes through. As a result, the steady state 60 Hz frequency signal, in this case the power line signal, is attenuated and thereby removed. However, since the 60 Hz test signal is phase modulated and remains out of phase with the steady state power line signal, its voltage level varies at the same point in each cycle. This variable signal passes through the two groups of capacitor arrays, and on through amplifier A5.

The test signal which is produced by coherent filter 32 is in a discrete time form, and is reconstructed by reconstruction band-pass filter 35. The design of bandpass filter 35 is similar to that of band-pass filter 31, with a center frequency of 60 Hz and with resistors R11, R12 and R15 determining the center frequency and the filter gain.

Precision diode detector 36 converts the output signal of band-pass filter 35 into a uni-polar signal by using a precision diode. This diode is constructed from a conventional diode CR4, which is connected in conjunction with operational amplifier A6 as a feedback element. This configuration has the advantage that its output is independent of the "on" voltage of diode CR4. In other words, the detector output is linear with respect to its input voltage. Furthermore, this precision diode arrangement does not require any temperature compensation.

The input to line voltage peak detector 38 is obtained from one part of the secondary winding of transformer 13 so that the input voltage to peak detector 38 is scaled down by the same factor used in input attenuator 30. The voltages at diode CR2 and CR3 are then proportional to the line voltages in the isolated power system at terminals T1 and T2. The higher value appears at the junction of R61, CR2 and CR3, causing the diode through which the lower voltage signal flows to be reversed biased.

Amplifier A8 is used in conjunction with resistor 54 and potentiometer R5 to provide an accurate match of the gain of input attenuator 30 to the transformer turns ratio of the secondary transformer 13. R56 provides protection from power line transients. Resistor R4, amplifier A8, and resistor R61 in combination with C16 are used to filter the output of CR2 and CR3.

Referring to FIG. 7, integrater/error amplifier 37 integrates the output of precision diode detector 36 and compares it with the output of line voltage peak detector 38. The outputs from precision diode detector 36 and line voltage peak detector 38 are received through resistors R13 and R14 respectively, wherein the sum of these inputs is integrated by amplifier A7 to produce a DC voltage proportional to the maximum total hazard current.

The components used in integrater/error amplifier 37 also play a dominant role in the determination of the characteristics of the entire control loop. Resistor 14 controls the loop gain while the time constant formed by R13 and C15 controls the response time. Diode CR5 prevents the integrator output from falling below $-0.7$ volts, thus preventing the loop from working with negative voltages.

Dynamic range limiter 39, as stated above, acts to prevent the line isolation monitor from responding to insignificant hazard currents, thereby improving the stability of the line isolation monitor system by limiting its linear range to total hazard currents between 150 microamps and 3.0 mA. This function is accomplished by a voltage divider using resistors R16 and R17, which assures that a minimum positive voltage is always applied to signal generator 40 and the indicator systems.

Signal generator 40 consists of transmission gate switch S2 which is actuated in response to timing signal "F" produced by phase modulator 56. Timing signal F, as will be discussed in greater detail below, consists of a 60 Hz pulse train whose phase is periodically reversed. The output of generator 40 is then a phase modulated pulse train whose amplitude is proportional to the total hazard current in the isolated power system being monitored.

Test signal filter 41 is an active band-pass filter with a center frequency of 60 Hz and a "Q" of 2, which converts the pulse train from signal generator 40 into a 60 Hz phase modulated sine wave. The center frequency and Q factor are determined by resistors R22, R24, and R25 with R22 and R24 acting as an attenuator pad to prevent the filter from saturating.

Resistor R23 and transmission gate switch S3 are utilized to maintain the center frequency and Q factor of filter 41 at a constant value despite the operation of switch S2. To accomplish this result, switch S3 is driven by timing signal $\overline{F}$, which is generated by test signal filter timing circuit 58.

Test signal amplifier 42 amplifies the sine wave test signal for injection into the power line of the isolated power system and converts the voltage signal into a current signal, while minimizing the contribution of the LIM circuitry to the hazard current of the isolated power system. The gain of amplifier A11 is controlled by resistors R47 and potentiameter R48. Resistors R35 and R36 form a bias network for transistor Q2, but are connected to the non-inverting input of amplifier A11 to remove the effect of resistors R35 and R36 on the AC gain of amplifier A11. The common emitter configuration of Q2 and the high impedance for R51 reduce the contribution of the LIM to the maximum hazard current to approximately 18 microamps RMS, which is well below a satisfactory level for any line isolation monitor system.

Non-linear time constant 48 provides the line isolation monitor with a fast response time for large changes in the total hazard current and good noise immunity under steady state conditions. When a large change in the total hazard current occurs, either diode CR6 or CR16 is turned on, thereby adding resistor R53 to the circuit to improve the response to the change in the total hazard current. However, once steady state conditions are reached, neither diode conducts and resistor R53 is removed from the circuit, thereby increasing the response time. As a result, the indicators will not respond as fast to the random level variations in the range of the total hazard current caused by power line noise. Diode CR6 is selected to be a germanium diode while diode CR16 is selected to be a silicon diode. Diode CR6 permits R53 to be quickly connected into the circuit when a fast increase in total hazard current is experienced. Diode CR16 permits R53 to be connected when a fast decrease in total hazard current is experienced, though with a slower response time than with diode CR6.

Meter circuit 49 converts the output of non-linear time constant 48 into a current which drives total hazard current (THC) meter 50 (not shown in FIG. 7). A current source is selected so that additional meters may be added to the output of meter circuit 49 without recalibration of the meter circuit. Potentiometer R21 is used to calibrate THC meter 50. Resistor R19 provides short circuit protection for amplifier A9. Capacitor C33 helps to insure stability of amplifier A9 whenever long cables are required to connect THC meter 50.

Alarm circuit 51 consists of a threshold detector system and a switch. The threshold detector system is a voltage comparator which causes its output to turn off whenever the input voltage is larger than the reference voltage. The reference voltage is determined by variable resistor R29 and resistor R30 and compared to the voltage level from the output of non-linear time constant 48 by amplifier A12. Resistor R28 is connected in the positive feedback loop of amplifier A12 to provide hysteresis, thereby preventing the alarm circuit from oscillating when the two voltage inputs to amplifier A12 are nearly the same. Once the total hazard current rises above the trip level, the output of amplifier of A12 falls below that required to maintain transistor Q1 on. At this time, audible alarms 52 and visual alarms 53 are activated.

Referring to FIG. 8, which illustrates the circuitry for the various LIM timing circuits, phase locked loop input signal conditioner 43 consists of opto-isolator circuit 60, a low-pass filter, and a zero-crossing detector. The opto-isolator 60 provides a reference signal for the phase locked loop 44, without significantly increasing the LIM contribution to the maximum hazard current. Diode CR 20 converts opto-isolator 60 from a uni-directional device to a bi-directional device. Opto-isolator 60 is a commonly known circuit device available from Fairchild, Part. No. FCD8106.

Resistor R37 and capacitor C26 form a single pole, low-pass filter for removing power line transients. Amplifier A13 acts as the zero-crossing detector and transforms the filtered 60 Hz reference signal into a square wave.

Phase-locked loop 44 provides an output which is phase-locked to the power line signal from the isolated power system. The operation of phase locked loop 44 can best be understood by reference to the block diagram illustrated in FIG. 11. The phase locked loop circuitry is connected in a closed loop configuration which includes phase detector 61a, low pass filter 64, voltage controlled oscillator (VCO) 61b, and frequency divider 65. Phase detector 61 compares the phase of the reference input signal from conditioner 43 (which is a square wave signal either in phase with the power line signal or having a constant phase angle with the power line signal) with the "divided-by-four" output of VCO 61b, and produces a signal proportional to the phase difference between the two. This signal is passed through low pass filter 64 and used to control the frequency of VCO 61b. The closed loop reaches an equilibrium when the output of phase detector 61a is zero, wherein the divider outputs will all be phase locked to the input reference signal. Five output signals are then extracted from the loop, a 240 Hz signal at terminal T8 from the output of VCO 61b, and four 60 Hz quadratured outputs from frequency divider 65, at terminals T4, T5, T6 and T7.

Now, referring again to the detailed circuit diagram in FIG. 8, phase detector 61a and VCO 61b appear as one system identified as VCO/phase detector 61. Combination circuits such as this are easily available and can be acquired from RCA, part number CD4046AE. Resistor R38 and capacitor C27 are chosen to control the free running frequency of the VCO output at approximately 240 Hz. The low pass filter 64 of FIG. 11 is a first order lead-lag network consisting of resistors R41 and R42 and capacitor C29. Also, capacitor C28 provides additional filtering for sharp transitions of the phase detector output without affecting the loop filter characteristics. Resistors R39 and R40 are used to add a slight negative bias to the output of low-pass filter 64, thereby introducing a slight phase error between the reference input and the outputs of phase locked loop 44 when the loop is locked. This slight phase error keeps the phase detector out of a "dead band" area in its transfer characteristic to maintain circuit stability.

Low pass filter 64 is designed to have a damping ratio of approximately 0.707 and a natural frequency of 10 Hz. This combination of parameters in the phase locked loop provides a maximum response time without overshoot, while at the same time permits the loop to accurately follow low frequency phase variations in the power line.

Flip-flops 61 and 62 cooperate to function as frequency divider 65. Each flip-flop is continuously clocked by the 240 Hz pulse train from VCO/phase detector 61. A sample clock pulse train is shown in FIG. 12. This pulse train also appears at output terminal T8 of phase-locked loop 44. The 60 Hz pulse train from VCO/phase detector 61 is applied to the $\bar{Q}$ output of flip-flop 63 to establish a reference level.

Each time flip-flops 62 and 63 receive a clock pulse, the logical value on its respective "D" terminal is switched to its respective "Q" terminal. The net result is the production of four quadratured 60 Hz pulse trains, each a multiple of 90° out of phase with another, one at each output terminal T4, T5, T6 or T7. Examples of these pulse trains are illustrated in FIG. 12, where each pulse train is identified by its respective output terminal.

Sample/hold timing circuit 46 uses the 240 Hz output of phase locked loop 44 at terminal T8 to generate timing pulses at a frequency of 240 Hz with a pulse width of 240 microseconds, referred to above as timing signal "E". The values of resistor R43 and capacitor C30 determine the width of the pulses. NAND gate G1 operates as an inverter. NAND gate G2 receives the T8, 240 Hz timing pulse train and the inverted output of gate G1, and produces a narrow negative going pulse for timing signal $\bar{E}$. NAND gate G3 inverts the G2 output to positive going pulses, identified as timing signal E, which is used to control sampling gate S1 of coherent filter 32. An example waveform of timing signals E and $\bar{E}$ is shown in FIG. 12.

Commutated capacitor array timing circuit 47 utilizes all four 60 Hz quadratured outputs from phase locked loop 44, at terminals T4, T5, T6 and T7. These four outputs plus timing signal $\bar{E}$ are combined in NAND gates G4 and G5 and NOR gates G6, G7, G8 and G9 to produce four, non-overlapping timing signals, "A", "B", "C", and "D" (see FIG. 12). As discussed above, these timing signals are used to sequentially commutate the capacitors in capacitor array 34.

The basic operation of coherent filter 32 requires a sequential operation wherein sampling gate S1 is continuously closed in its sampling mode for a very short time interval and one of the capacitors in each group of capacitors is commutated for most of the remaining time period that gate S1 remains open. The requisite timing signal sequence is a short pulse on E, and a longer pulse on either A, B, C or D. After the next pulse on E, a pulse by one of the remaining capacitor array timing signals occurs. This sequence continues until a pulse has been produced by all capacitor array timing signals A, B, C, and D. Then the sequence repeats itself.

This sequential operation is obtained in the following fashion. NAND gates G4 and G5 receive an $\bar{E}$ input and either a T4 or T5 input. The outputs from NAND gates G4 and G5 control the bank of NOR gates G6, G7, G8 and G9 in such a fashion that their outputs are inhibited during the time an output pulse is produced by sample hold timing circuit 46, timing signal "E". Pulse trains "H" and "I" in FIG. 12 illustrate the outputs of NAND gates G4 and G5.

Nor gates G6, G7, G8 and G9 receive a second input from either output terminal T6 or T7. The resultant timing signals appear as 60 Hz pulses having a pulse width of approximately 3.927 msec. Inherent delays within the logic circuitry are used to reduce the width of the pulses of timing signals A, B, C, and D to provide sufficient space between these signals and the pulse of timing signal E. Again, the four pulse trains are out of phase with each other by multiples of 90°.

Phase modulator 56 receives two 60 Hz pulse trains which are 180° out of phase with each other, which inputs are received from output terminals T4 and T5 of phase-locked loop 44. Functionally, these inputs are alternately connected to the modulator 56 output in response to oscillator 57, to produce timing signal "F", whose phase is varied 180° at the oscillator output frequency.

More specifically, oscillator 57 is designed to oscillate at 10 Hz, thereby producing output pulse train "J", shown in FIG. 13. NOR gate G13 is connected as an inverter and produces output pulse train "K". NOR gate G12 outputs the inverse of pulse train T4 during 180° of each cycle of pulse train "J" from oscillator 57. NOR gate G14 outputs the inverse of pulse train T5 during the remaining 180° of each cycle of pulse train "J". NOR gate G15 sums these two outputs and inverts them into the wave form shown in FIG. 13. As can be seen in FIG. 13, the phase of pulse train "F" changes 180° at the leading and trailing edge of each pulse in pulse train "J".

The low voltage supplied to the various circuit elements by low voltage power supply 59 is +6.5Vdc or −6.5Vdc, indicated in the drawings as B+ or B−. When high voltage is required by the noted circuit elements, the symbol of HV is used. This voltage is typically 275 Vdc and is provided by high voltage power supply 60. The specific circuitry design for these bias voltage power supplies is not relevant to the subject invention and can be provided by those skilled in the art. Therefore, no specific illustration or discussion of this aspect is provided.

While a particular embodiment of this invention has been shown and described, it is obvious that changes and modifications can be made without departing from the true spirit and scope of the invention. It is the intention in the appended claims to cover all such changes and modifications.

I claim:

1. A method of determining hazard current in an AC isolated power system, said method comprising:
   (a.) determining the ground fault impedance between a preselected point in the isolated power system and ground at the isolated power system power line signal frequency by injecting a test signal into the isolated power system at the preselected point, said test signal having a frequency exactly equal to the isolated power line signal frequency and having a predetermined, small current compared to the isolated power system current level, recovering said test signal by extracting the combined test signal and power line signal and separating the test signal component from the isolated power line signal, phase modulating the injected test signal so that it remains out of phase with the isolated power line signal and so that its phase relation varies periodically, thereby permitting easier separation of the test signal from the isolated power line signal, determining the voltage of the recovered test signal, thereby providing the value of the ground fault impedance from the relation of the test signal current and the recovered test signal voltage;
   (b.) determining the maximum voltage of the power line signal; and
   (c.) combining the maximum voltage value with the ground fault impedance value to provide the value of the total hazard current, or a value related to the value of the total hazard current.

2. The method recited in claim 1, wherein the preselected point is a common mode impedance point in the isolated power system.

3. The method recited in claim 2, wherein the combined test signal and line voltage signal is extracted from the common mode impedance point in the isolated power system.

4. The method recited in claim 1, wherein the test signal is separated from the isolated power line signal by subtracting from the combined test and power line signals that component which is in phase with the isolated power line signal.

5. The method recited in claim 4, wherein the test signal is phase modulated by periodically shifting its phase by 180°.

6. The method recited in claim 4, wherein the subtraction of signals in phase with the isolated power line signal includes:
   (a.) converting the combined test and power line signals into discrete-time signals;
   (b.) sequentially connecting the discrete-time signals to each one of a plurality of capacitors, said sequential operation being controlled in response to the phase of the isolated power line signal such that each capacitor is connected to receive the discrete-time signal for a predetermined length of time and at the exact location in each cycle of the isolated power line signal, thereby causing the isolated power line signal to appear as a stationary signal to each capacitor and the test signal to appear as a varying signal, whereupon only the test signal will be recovered; and,
   (c.) converting the recovered discrete-time signal to a real time signal.

7. The method recited in claim 6, wherein the preselected point is a common mode impedance point in the isolated power system.

8. The method recited in claim 7, wherein the combined test signal and line voltage signal is extracted from the common mode impedance point in the isolated power system.

9. The method recited in claim 8, wherein the test signal is phase modulated by periodically shifting its phase by 180°.

10. A method for determining hazard current in an AC isolated power system by a closed loop operation, wherein the isolated power system fault impedance is determined at the power line frequency of the isolated power system and said fault impedance value is compared to the power line voltage to provide an indication of the total hazard current, said method comprising:
    (a.) generating a test signal having a predetermined current level and having a frequency exactly equal to the power line frequency but out of phase with the power line frequency;
    (b.) injecting the test signal into the isolated power system at a preselected point;
    (c.) extracting an output signal from the isolated power system, said output signal having the power line signal and the test signal;
    (d.) filtering said output signal to recover only the test signal out of phase with the isolated power system frequency;
    (e.) determining the voltage of the recovered test signal, said voltage being related to the fault impedance magnitude;
    (f.) determining the voltage of the power line signal;
    (g.) comparing the voltage magnitudes of the recovered test signal and the power line voltage and producing an error signal related to these two values;
    (h.) adjusting the current level in the test signal generated until the error signal reaches a predetermined value, thereby varying the voltage of the recovered test signal; and,
    (i.) determining the current level in the test signal, which current level is related to the isolated power system hazard current.

11. The method recited in claim 10, wherein the preselected point is a common mode impedance point in the isolated power system.

12. The method recited in claim 11, wherein the combined test signal and line voltage signal is extracted from the common mode impedance point in the isolated power system.

13. The method recited in claim 10 further comprising phase modulating the test signal injected into the isolated power system.

14. The method recited in claim 10, further comprising phase modulating the injected test signal so that it remains out of phase with the power line signal and so that its phase relation varies periodically, thereby permitting easier separation of the test signal from the isolated power line signal.

15. The method recited in claim 14, wherein the test signal is phase modulated by periodically shifting its phase by 180°.

16. The method recited in claim 14, wherein the filtering step is accomplished by subtracting from the combined test and power line signals that component which is in phase with the isolated power line signal.

17. The method recited in claim 16, wherein the subtraction of signals in phase with the isolated power line signal includes:
 (a.) converting the combined test and power line signals into discrete-time signals;
 (b.) sequentially connecting the discrete-time signals to each one of a plurality of capacitors, said sequential operation being controlled in response to the phase of the isolated power line signal such that each capacitor is connected to receive the discrete-time signal for a predetermined length of time and at the exact location in each cycle of the isolated power line signal, thereby causing the isolated power line signal to appear as a stationary signal to each capacitor and the test signal to appear as a varying signal, whereupon only the tests signal will be recovered; and,
 (c.) converting the recovered discrete-time signal to a real time signal.

18. The method recited in claim 17, wherein the preselected point is a common mode impedance point in the isolated power system.

19. The method recited in claim 18, wherein the combined test signal and line voltage signal is extracted from the common mode impedance point in the isolated power system.

20. The method recited in claim 19, wherein the test signal is phase modulated by periodically shifting its phase by 180°.

21. A line isolation monitor for determining hazard current in an AC isolated power system by measuring the ground fault impedance at the power line signal frequency of the isolated power system and comparing it to the power line signal voltage to determine the total hazard current, said line isolation monitor comprising:
 (a.) means, responsive to a first control signal, for generating a test signal having a frequency exactly equal to the power line signal frequency and having a predetermined current level, said test signal also being out of phase with the power line signal frequency;
 (b.) meter means for sensing and providing a reading related to the test signal current level;
 (c.) means for injecting the generated test signal into the isolated power system;
 (d.) means for extracting the combined test signal and power line signal from the isolated power system;
 (e.) filtering means for removing the power line signal component and for recovering the test signal component from the extracted signal;
 (f.) magnitude detector means for determining the voltage of the recovered test signal component and for producing an output signal related to the value of said voltage;
 (g.) peak detector means for producing an output signal related to the peak value of the power line signal voltage;
 (h.) means for comparing the output signals from the magnitude and peak detector means and for producing a resultant error signal related to the difference between said output signals; and,
 (i.) means responsive to the resultant error signal for producing the first control signal for varying the current level of the test signal productred by the test signal generating means, wherein the test signal current is varied until the test signal component voltage and the power line signal peak voltage obtain a predetermined relationship between each other, and whereby the hazard current magnitude may then be determined from the meter means.

22. The Line Isolation Monitor recited in claim 21, wherein the test signal is injected into the isolated power system at a common mode impedance point by the injection means.

23. The Line Isolation Monitor recited in claim 22, wherein the combined test and power line signal is extracted from the common mode impedance point by the extraction means.

24. The Line Isolation Monitor recited in claim 21, wherein the first control signal producing means comprises an integrator circuit.

25. The Line Isolation Monitor recited in claim 21, wherein the filtering means is a coherent filter.

26. The Line Isolation Monitor recited in claim 25, wherein the coherent filter is clocked in a phased-locked relation with the power line signal.

27. The Line Isolation Monitor recited in claim 26, wherein the coherent filter comprises:
 (a.) discrete-time conversion means for converting the combined test and power line signals into a discrete-time output signal; and,
 (b.) a commutated capacitor array having,
  1. at least one group of capacitors,
  2. a plurality of switches, each one associated with at least one capacitor in the at least one group of capacitors, each switch connected so that when commutated on, its respective capacitor will be connected to receive the discrete-time output signal, and
  3. means for sequentially commutating the switches in response to the phase of the power line signal such that each at least one capacitor is connected to receive the discrete-time signal for a predetermined length of time and at the exact location in each cycle of the power line signal, thereby causing the isolated power line signal component to appear as a stationary signal to each at least one capacitor, and the test signal component to appear as a varying signal, whereupon only the test signal will pass through the at least one group of capacitors to be received by the magnitude detector means.

28. The Line Isolation Monitor recited in claim 27, wherein the discrete-time conversion means is a sample/hold circuit which comprises:
 (a.) a timing switch connected to the output of the extraction means;
 (b.) a capacitor connected between ground and the output of the timing switch;
 (c.) means for commutating the timing switch at a frequency having a multiple of the power line signal frequency and in phased-locked relation with the power line signal frequency, and for a predetermined time interval each time.

29. The Line Isolation Monitor recited in claim 28, wherein the commutated capacitor array comprises:
(a.) two groups of capacitors with their associated switches, each switch in one group operating simultaneously with a switch in the second group, each group having the same input;
(b.) resistance means connected between the output of each group of capacitors;
(c.) amplifier means having its negative input connected to the output of one of the group of capacitors, the output of said amplifier means serving as the capacitor array output; and,
(d.) feedback means connected between the output of the other group of capacitors and the amplifier means output.

30. The Line Isolation Monitor recited in claim 29 wherein the first control signal producing means comprises an integrator.

31. The Line Isolation Monitor recited in claim 30, further comprising an isolation transformer with its primary winding connected to the power lines of the isolated power system, and wherein the common mode impedance point is the center tap of the primary winding.

32. A line isolation monitor for determining hazard current in an AC isolated power system which measures the ground fault impedance at the power line signal frequency of the isolated power system and compares it to the power line signal voltage to determine the total hazard current, said line isolation monitor comprising:
(a.) an isolation transformer having its primary winding connected between the two isolated power system power lines, and further having a center tap terminal for the primary winding which serves as a common mode impedance point to the power lines of the isolated power system;
(b.) means, responsive to a first control signal, for generating a test signal having a frequency exactly the same as the power line signal frequency and having a predetermined current level, said test signal also being out of phase with the power line signal frequency;
(c.) meter means for sensing and providing a reading related to the test signal current level;
(d.) means for injecting the test signal into the isolated power system at the common mode impedance point;
(e.) means, for extracting the combined test signal and power line signal from the isolated power system at the common mode impedance point;
(f.) filtering means for removing the power line signal component and for recovering the test signal component from the extracted signal;
(g.) magnitude detector means for determining the voltage of the recovered test signal component and for producing an output signal related to the value of said voltage;
(h.) peak detector means for producing an output signal related to the peak value of the power line signal voltage;
(i.) means for comparing the output signals from the magnitude and peak detector means and for producing a resultant error output signal related to the difference between said output signals; and,
(j.) means responsive to the resultant error output signal for producing the first control signal for varying the current level of the test signal produced by the test signal generating means, wherein the test signal current is varied until the test signal component voltage and the power line peak voltage obtain a predetermined relationship between each other, and whereby the reading on the meter means is related to the hazard current magnitude.

33. The Line Isolation Monitor recited in claim 32, wherein the voltage of the first control signal is related to the actual hazard current, and the test signal generating means comprises:
(a.) means, responsive to the first control signal, for producing a test pulse train having a voltage related to the voltage level of the first control signal;
(b.) means for phase modulating the test pulse train to remain out of phase with the power line signal and to have a periodically varying phase angle;
(c.) means for converting the phase modulated output test pulse train from a pulse wave to a sine wave with its voltage being related to the voltage of the output test pulse wave; and,
(d.) means for converting the sine wave into the test signal having a current level related to the voltage level of the sine wave.

34. The Line Isolation Monitor recited in claim 32, wherein the voltage of the first control signal is related to the actual hazard current, and the test signal generating means comprises:
(a.) means for producing a second control signal which varies between two states;
(b.) means, responsive to the second control signal, for sampling the first control signal, thereby producing an output test pulse train with a magnitude related to the first control signal and a pulse waveform related to the second control signal;
(c.) means for converting the phase modulated output test pulse train from a pulse wave to a sine wave with its voltage being related to the voltage of the output test pulse wave; and,
(d.) means for converting the sine wave into the test signal having a current level related to the voltage level of the sine wave.

35. The Line Isolation Monitor recited in claim 34, wherein the second control signal producing means comprises:
(a.) phase-locked loop means, responsive to the power line signal, for producing timing signals related to the frequency and phase of the power line signal; and
(b.) phase modulator means, responsive to at least one timing signal, for producing the second control signal.

36. The Line Isolation Monitor recited in claim 35, wherein the phase modulator means comprises:
(a.) oscillator means for producing a pulse train having a predetermined frequency;
(b.) first logical switching means connected to one timing signal output of the phase-locked loop means having a first predetermined phase relation with the power line signal, said switching means producing the second control signal having a phase related to the first timing signal, only in response to one state of the oscillator output pulse train; and,
(c.) second logical switching means connected to another timing signal output of the phase-locked loop means having a second predetermined phase relation with the power line signal, said second switching means producing the second control having a phase related to the second timing signal, only in response to the other state of the oscillator output pulse train, whereby the phase modulator output varies between the two phase angles of the timing signals at a frequency controlled by the oscillator.

37. The Line Isolation Monitor recited in claim 36, wherein the two timing signals have phase angles 180° apart.

38. The Line Isolation Monitor recited in claim 36, wherein the filtering means is a coherent filter clocked in a phase-locked relation with the power line signal, and wherein said coherent filtering means comprises:
(a.) discrete-time conversion means for converting the combined test and power line signals into a discrete-time signal;
(b.) a commutated capacitor array having,
1. at least one group of capacitors,
2. a plurality of switches, each one associated with at least one capacitor in the at least one group of capacitors, each switch connected so that when commutated on, its respective capacitor will be connected to receive the discrete-time signal, and
3. means for sequentially commutating the switches in responses to the phase of the power line signal such that each at least one capacitor is connected to receive the discrete-time signal for a predetermined length of time and at the exact location in each cycle of the power line signal, thereby causing the isolated power line signal to appear as a stationary signal to each at least one capacitor, and the test signal to appear as a varying signal, whereupon only the test signal will pass through the at least one group of capacitors to be received by the magnitude detector means.

39. The Line Isolation Monitor recited in claim 38, wherein, the discrete-time conversion means is a sample/hold circuit which comprises:
(a.) a timing switch connected to the output of the extraction means;
(b.) a capacitor connected between ground and the output of the switch;
(c.) means for commutating the timing switch at a frequency having a multiple of and phased-locked relation with the power line signal frequency, and for a predetermined time interval each time.

40. The Line Isolation Monitor recited in claim 39, wherein the timing switch commutating means comprises means, responsive to at least one timing signal from the phase-locked loop, for producing output signals of the same frequency with narrower pulse widths.

41. The Line Isolation Monitor recited in claim 40, wherein the sequentially commutating means comprises means, responsive to at least one timing signal from the phase-locked loop, for producing a plurality of separate output signals on their respective output terminals, each terminal connected to its respective capacitor array switch, so that each switch is sequentially commutated on.

42. The Line Isolation Monitor recited in claim 41, wherein the sequentially commutating means includes means, responsive to the timing switch commutating means output, for preventing an output signal from being produced which will commutate any of the capacitor array switches closed when the timing switch of the sample/hold circuit is closed.

* * * * *